United States Patent [19]

Okada et al.

[11] Patent Number: 4,838,089

[45] Date of Patent: Jun. 13, 1989

[54] SEMICONDUCTOR PRESSURE SENSOR

[75] Inventors: Hiroshi Okada, Hekinan; Yukihiro Kato, Kariya; Osamu Ina, Anjo; Kazuhisa Ikeda, Toyota, all of Japan

[73] Assignee: Nippondenso Co., Ltd., Kariya, Japan

[21] Appl. No.: 46,582

[22] Filed: May 6, 1987

[30] Foreign Application Priority Data

May 7, 1986 [JP] Japan .................................. 61-104458
Jan. 16, 1987 [JP] Japan ...................................... 62-8594
Feb. 12, 1987 [JP] Japan ..................................... 62-30079

[51] Int. Cl.$^4$ .......................... G01L 7/08; G01L 9/06
[52] U.S. Cl. ........................................ 73/727; 73/115; 73/721; 73/756; 338/4
[58] Field of Search ................. 73/756, 727, 721, 431, 73/DIG. 4, 115; 338/4; 29/610 SG

[56] References Cited

U.S. PATENT DOCUMENTS 4,295,117 10/1981 Lake et al. .............................. 338/4
4,413,527 11/1983 Sugiura et al. ....................... 73/754

FOREIGN PATENT DOCUMENTS 57-66328 4/1982 Japan .
57-44691 10/1982 Japan .
59-98339 7/1984 Japan .
60-149938 8/1985 Japan .
60-171429 9/1985 Japan .

Primary Examiner—Donald O. Woodiel
Attorney, Agent, or Firm—Cushman, Darby & Cushman

[57] ABSTRACT

The semiconductor pressure sensor embodying the present invention comprises a housing. A sensor board is located in this housing. A pressure-sensing chip, which is formed of a semiconductor and capable of measuring the pressure of a pressure medium, is mounted on the sensor board. Another semiconductor chip, which operates in cooperation with the pressure-sensing chip, is also mounted on the sensor board. A shielding member is located in the housing. This shielding member encloses the pressure-sensing chip in such a manner that the pressure-sensing chip is isolated from the semiconductor chip, and defines a storage chamber which is airtight from the other regions in the housing and adapted to store the pressure-sensing chip. The interior of the housing, except for the storage chamber, is filled with filler, so as to protect the semiconductor chip.

13 Claims, 4 Drawing Sheets

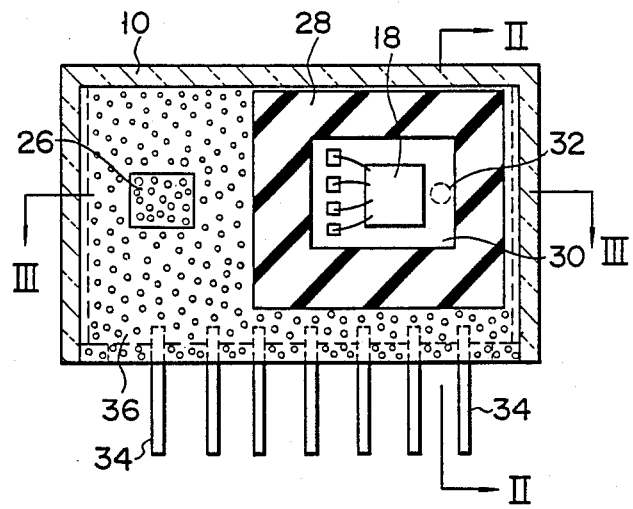
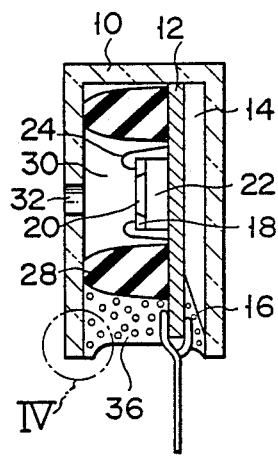
FIG. 1
FIG. 2
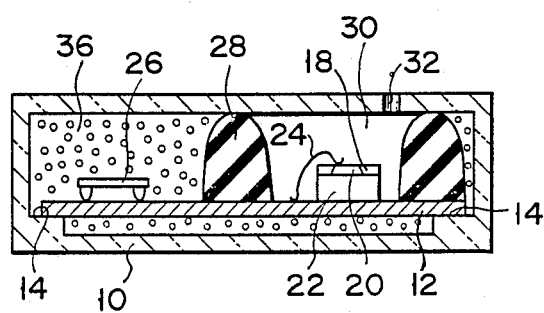
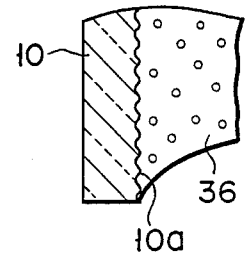
FIG. 3
FIG. 4

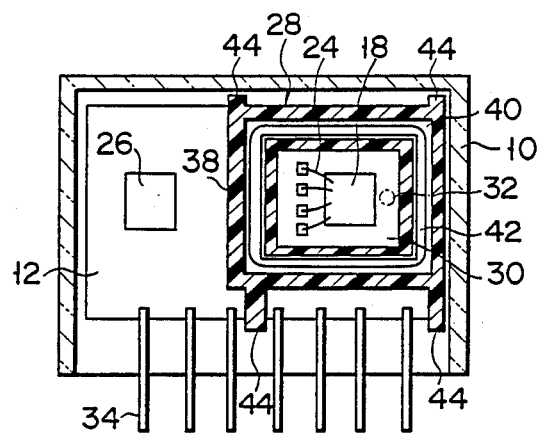
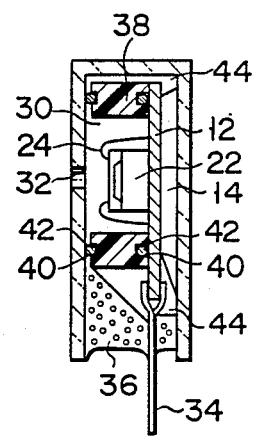
FIG. 5
FIG. 6
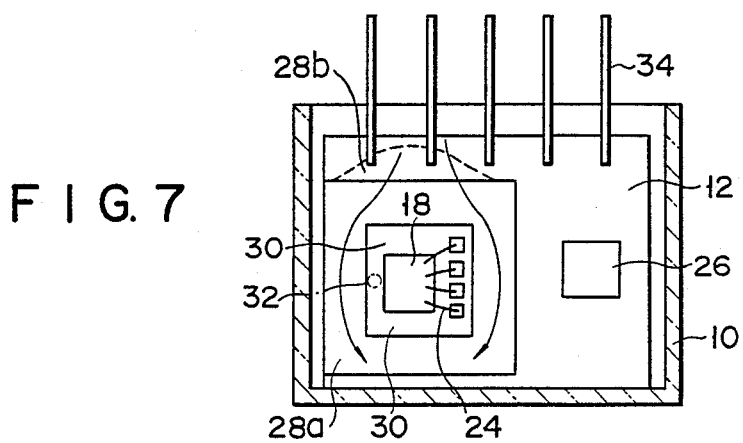
FIG. 7
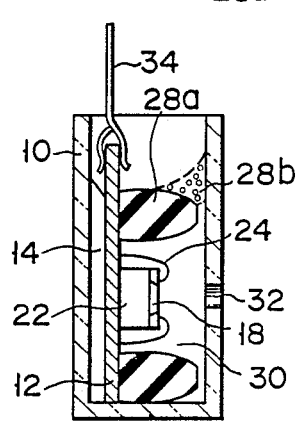
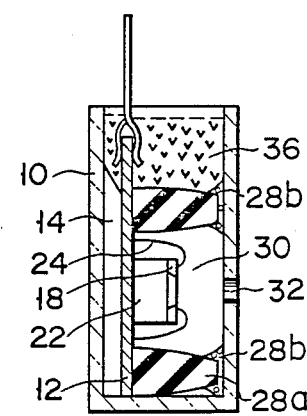
FIG. 8
FIG. 9

SEMICONDUCTOR PRESSURE SENSOR

BACKGROUND OF THE INVENTION

The present invention relates to a semiconductor pressure sensor to be assembled on a printed circuit board, and more particularly to a semiconductor pressure sensor suitable for measuring the pressure of the intake air of the engine of an automobile.

A semiconductor pressure sensor of this type is disclosed in U.S. Pat. No. 4,413,527, for example. The conventional sensor disclosed in this U.S. Patent comprises: a housing; a sensor board located in the housing; a sensor chip assembled on the sensor board; and a circuit unit assembled on the sensor board and used for processing electric signals supplied from the sensor chip. The interior of the housing is filled with synthetic resin, so as to protect the circuit unit from water and oil. In other words, the circuit unit is embedded in a filler formed of the synthetic resin.

Since the interior of the housing is filled with the filler, the sensor chip is enclosed in a metal package, thereby protecting the sensor chip from the filler. With this construction, however, a sensor unit, which is constituted by the sensor chip and the metal packaging, is inevitably large, due to the restrictions in the manufacturing of the package. Accordingly, the semiconductor pressure sensor itself is inevitably large. Furthermore, the sensor of the U.S. Patent must use a pressure-introducing pipe which extends through the package in an airtight manner, so as to guide the pressure medium to be measured to the sensor chip. The sensor disclosed in U.S. Pat. No. 4,413,527 must also use a plurality of connecting pins which extend through the package in an airtight manner and electrically connect the sensor chip and the sensor board to each other to supply electric signals from the sensor chip to the outside of the package.

Accordingly, as long as a sensor unit is formed by enclosing a sensor chip with a metal package, the semiconductor pressure sensor has the following problems: the sensor unit itself is large and a large number of parts are required, thereby complicating the construction of the sensor due to the necessity of using the pressure-introducing pipe and connecting pins.

SUMMARY OF THE INVENTION

Accordingly, the object of the present invention is to provide a semiconductor pressure sensor which simplifies construction by decreasing the number of parts required and is easily assembled.

To achieve this object, the present invention provides a semiconductor pressure sensor, comprising:
a housing;
a board located in the housing and having a circuit face on which a wiring pattern is formed;
a pressure-sensing chip formed of a semiconductor and assembled on the circuit face of the board;
at least one semiconductor chip assembled on the circuit face of the board;
a shielding member which is located in the housing in such a manner as to isolate the pressure-sensing chip from the semiconductor chip and to define a storage chamber for the pressure-sensing chip in the housing, together with the housing and the board; and
means, provided in the housing, for guiding a pressure medium to be measured into the storage chamber.

In the semiconductor pressure sensor of the present invention, the shielding member is located in the housing, and this shielding member defines an airtight storage chamber in which the pressure-sensing chip is isolated from the other semiconductor chips. With this construction, even if filler is used in the interior of the housing to protect the semiconductor chip from water and oil, it does not enter the storage chamber, so that the pressure-sensing chip can be reliably protected from the filler.

In the storage chamber of the housing, there is obstacle between the circuit face of the board and the pressure-sensing chip which makes electrical connections difficult. No special connector is required for this electrical connection. In the semiconductor pressure sensor of the present invention, therefore, the electrical connection can be established easily, without increasing the number of parts required. This advantageous electrical connection cannot be realized using conventional semiconductor pressure sensors because the pressure-sensing chip is enclosed by a metal package.

In the semiconductor pressure sensor of the present invention, furthermore, the storage chamber is defined by using a shielding member, not a metal package. Since the shielding member does not have any restrictions in its manufacture, the storage chamber can have the smallest possible size, thus contributing to the reduction in the size of the semiconductor pressure sensor.

BRIEF DESCRIPTION OF THE DRAWINGS

These and other advantages of the present invention may be appreciated from studying the following detailed description of the presently preferred exemplary embodiment together with the drawings in which:

FIG. 1 is a sectional view illustrating a semiconductor pressure sensor according to the first embodiment of the present invention;

FIG. 2 is a sectional view taken along line II—II in FIG. 1;

FIG. 3 is a sectional view taken along line III—III in FIG. 1;

FIG. 4 is an enlarged view of the portion indicated by IV in FIG. 2;

FIGS. 5 and 6 are sectional views illustrating a semiconductor pressure sensor according to the second embodiment of the present invention;

FIGS. 7 through 9 are sectional views illustrating a semiconductor pressure sensor according to the third embodiment of the present invention;

DETAILED DESCRIPTION OF THE PREFERRED EMBODIMENTS

Figure 10:
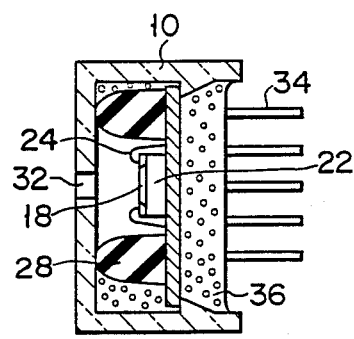
FIG. 10 is a sectional view illustrating a semiconductor pressure sensor according to the fourth embodiment of the present invention.

Referring to FIG. 1, the semiconductor pressure sensor of the first embodiment is disposed within housing 10. This housing is in the form of a flat box, without a bottom section, as viewed in FIG. 1. Housing 10 is formed of polybutylene terephthalete (PBT), polyphenylenesulfide (PPS), polyethersulfone (PES), polycarbonate (PC), etc., and preferably formed of a transparent material such as PES or PC.

Sensor board 12, formed of ceramics, is located within housing 10. A thick-film resistor circuit (not shown) is formed on at least one side of sensor board. Sensor board 12 is inserted through the opening of housing 10 and is positioned in housing 10. When inserted, sensor board 12 is guided by a pair of guides 14 on the inner face of housing 10, as can be seen from FIGS. 2 and 3. Guide 14 has slanted surface 16 at the end near the opening of housing 10, and this slanted surface facilitates insertion of sensor board 12. Sensor board 12 does not have to be a ceramic board; it may be a board formed of glass and epoxy resin, a board formed of enameled substance, or a board formed of phenol.

Pressure-sensing chip 18 (hereinafter referred to simply as a sensor chip), formed of a semiconductor, is attached to sensor board 12 such that it is shifted from the center of sensor board 12. Sensor chip 18 includes a diaphragm portion formed in a silicon piece, and a strain gauge located in the center of the diaphragm portion. Since such a sensor chip is well known in the art, a further description of its construction will be omitted. Sensor chip 18 is mounted on seat 22, which defines vacuum chamber 20 (i.e., a reference-pressure chamber) together with the diaphragm portion of sensor chip 18. In the drawings, vacuum chamber 20 is depicted only schematically. Seat 22 is formed of a material which can suppress the thermal stress in sensor chip 18; it is formed of Pyrex glass, for example. Sensor chip 18 is coupled to sensor board 12 by securing seat 22 to sensor board 12 by means of an adhesive such as silicone rubber. Bonding wires 24 are used for electrically connecting sensor chip 18 and sensor board 12 to each other.

In addition to sensor chip 18, a circuit unit, such as semiconductor IC chip 26, is also electrically connected to sensor board 12 by soldering. As is obvious from FIG. 1, IC chip 26 is shifted from the center of sensor board 12 in such a manner that it is located on the opposite side of sensor chip 18. IC chip 26 serves to amplify electric signals from sensor chip 18.

Shielding member 28 is airtightly attached to sensor board 12. Shielding member 28 is formed of elastic sealant, e.g., nitrile rubber. As evident from FIG. 1, shielding member 28 has a shape that encloses sensor chip 18. When sensor board 12, on which sensor chip 18, IC chip 26, shielding member 28c, etc. are mounted, is inserted into housing 10 from the opening, shielding member 28 is elastically deformed, being sandwiched between sensor board 12 and housing 10. As a result, storage chamber 30, used for storing sensor chip 18, is defined by sensor board 12, housing 10 and shielding member 28. As can be seen from FIG. 3, shielding member 28 has a height slightly greater than the distance between housing 10 and sensor board 12 when no external force is applied to shielding member.

Through-hole 32 is formed in housing 10 to allow communication between storage chamber 30 and the outside of the sensor. In this embodiment, the location of through-hole 32 is determined such that sensor chip 18 and bonding wires 24 are located away from the extension of the axis of through-hole 32, as can be seen most clearly in FIG. 3. Even if foreign matter is included in the pressure medium which is to be introduced into storage chamber 30 via through-hole 32, it does not directly touch sensor chip 18 or bonding wires 24 as long as the location of through-hole 32 is determined as above. Therefore, sensor chip 18 and bonding wires 24 are prevented from being adversely affected by such foreign matter.

A plurality of connecting legs 34 are attached to that side of sensor board 12 which is located close to the opening of housing 10. Connecting legs 34 are arranged such that they are spaced a predetermined interval from each other. Connecting legs 34 are soldered, at one end, to the resistor circuit on sensor board 12, and are projected, at the other end, outwardly from housing 10. The projected end of each connecting leg 34 serves to electrically connect the semiconductor pressure sensor to a main printed circuit board.

Except in storage chamber 30, the interior of housing 10 is filled with filler 36 formed of epoxy resin, silicone rubber, or the like. Filler 36 serves to protect circuit units (e.g., IC chip 26) on sensor board 12 from water and oil. In this embodiment, the inner surface of housing 10 is worked by tumbling, using powder of glass or walnuts. Therefore, the inner surface is finely roughened, as indicated by 10a in FIG. 4. By roughening the inner surface of housing 10 in this fashion, a sufficiently adhesive bond is ensured between housing 10 and filler 36. Accordingly, it is possible both to improve the mechanical strength of the semiconductor pressure sensor itself and to reliably prevent moisture from entering housing 10. The surface roughened by tumbling does not adversely affect the outward appearance of housing 10, unlike a surface roughened by sand blasting or etching. Therefore, use of tumbling is advantageous particularly when housing 10 is formed of a transparent material.

With the semiconductor pressure sensor of the first embodiment, storage chamber 30, in which sensor chip 18 is isolated from filler 36, can be easily defined by simply pushing sensor board 12 into housing 10, with sensor chip 18, IC chip 26, shielding member 28, etc. mounted on sensor board 12. In addition, a pressure medium to be measured can be introduced into storage chamber 30 by simply forming through-hole 32 in housing 10. Further, it is easy to electrically connect sensor chip 18 to the resistor circuit of sensor board 12.

In the first embodiment, furthermore, sensor board 12 and connecting legs 34 are arranged in the same plane. Due to this arrangement, the semiconductor pressure sensor does not occupy much area on the main circuit board.

A semiconductor pressure sensor according to the second embodiment will be described with reference to FIGS. 5 and 6. Shielding member 28 used in the second embodiment includes frame 38 which encloses sensor chip 18. Frame 38 may be made of synthetic resin. Groove 40 is formed in the faces on each side of frame 38 in a rectangular pattern. O-ring 42, which is formed of an elastic material, is fitted in each groove 40. With this construction of shielding member 28, O-ring 42 at one side of frame 38 provides an airtight seal between frame 38 and sensor board 12 after frame 38 is secured to sensor board 12. O-ring 42 at the other side of frame 38 is brought into tight contact with the inner surface of housing 10 by simply pushing sensor board 12 into housing 10, so that storage chamber 30 can be easily defined, as in the first embodiment.

In the second embodiment, furthermore, hook 44 is provided at the four corners of frame 38, so as to allow frame 38 to be secured on sensor board 12. Each hook 44 is so shaped as to sandwich the corresponding side edge of sensor board 12 between the hook and sensor board 12. Incidentally, FIG. 5 does not illustrate filler 36, for the simplicity of the drawings. The succeeding Figures do not illustrate it for the same reason, since illustration thereof is absolutely necessary for explaining the embodiments to be mentioned below.

A semiconductor pressure sensor according to the third embodiment of the present invention will be described with reference to FIGS. 7 to 9. The semiconductor pressure sensor of the third embodiment comprises shielding element 28a. This shielding element has a similar shape to that of shielding member 28 used in the first embodiment, but, when it is inserted into housing 10 together with sensor board 12, a certain gap is provided between shielding element 28a and the inner surface of housing 10, as shown in FIG. 8. In the third embodiemnt, the gap is determined to be less than 0.3 mm. With this construction, sensor board 12, on which sensor chip 18, IC chip 26 and shielding element 28a are mounted, can be easily inserted into housing 10, utilizing the weight of sensor board 12 itself.

After the insertion of sensor board 12, the gap between housing 10 and shielding element 28a is filled with filling element 28b. Specifically, filling element 28b, in the form of liquid, is poured into the gap from the opening of housing 10 after the insertion of sensor board 12. In this embodiment, liquefied filling element 28b has relatively small viscosity, preferably smaller than 20 poise. Liquefied filling element 28b, which has been poured, flows through the gap between the inner surface of housing 10 and shielding element 28a, due to capillarity, as indicated by the arrows in FIG. 7. As a result, the gap is filled and sealed with filling element 28b. By properly controlling the amount of filling element 28b to be poured, the filling element can remain only in the gap between the inner surface of housing 10 and shielding element 28a; it does not flow into storage chamber 30 or touch sensor chip 18. By hardening filling element 28b thereafter, the shielding member of the third embodiment is obtained. In other words, the shielding member of the third embodiment includes shielding element 28a and filling element 28b.

After forming the shielding member as described above, connecting legs 34 are attached to sensor board 12 in the same manner as in the first embodiment. Thereafter, the interior of housing 10 is filled with filler 36, thus completing the semiconductor pressure sensor of the third embodiment.

With the semiconductor pressure sensor of the third embodiment, when sensor board 12, provided with shielding element 28a, is inserted into housing 10, shielding element 28a does not contact housing 10. Therefore, neither housing 10 nor sensor board 12 is applied with force during the insertion, thus enabling sensor board 12 to be located in housing 10 with ease and with high reliability. If housing 10 is formed of a transparent material, the condition of filling element 28b and that of filler 36 can be easily recognized from outside housing 10. If a pigment such as black one is mixed with both filling element 28b and filler 36, then the poured condition can be recognized more easily. In the third embodiment, the size of shielding element 28a is determined to satisfy the two requirements: one is that sensor board 12 and housing 10 must not be applied with force when sensor board 12, on which shielding element 28a is provided, is inserted into housing 10; and the other is that filling element 28b must be permitted to flow by capillarity. As long as these two requirements are satisfied, the size of shielding element 28a can be determined arbitrarily, so that the gap can be narrowed further from 0.3 mm. Filling element 28b may be formed of the same material as filler 36, and the viscosity of filling element 28b may exceed 20 poise.

The fourth embodiment of the present invention will be described with reference to FIG. 10. In the fourth embodiment, the opening of housing 10 is formed in the side wall opposing through-hole 32. With this construction, connecting legs 34 can be easily led out of housing 10 through the opening.

The fifth and sixth embodiments of the present invention will be described with reference to FIGS. 11 and 12, respectively. These embodiments differ from the above-mentioned embodiments, in that the shielding members do not have to enclose sensor chip 18.

Figure 11:
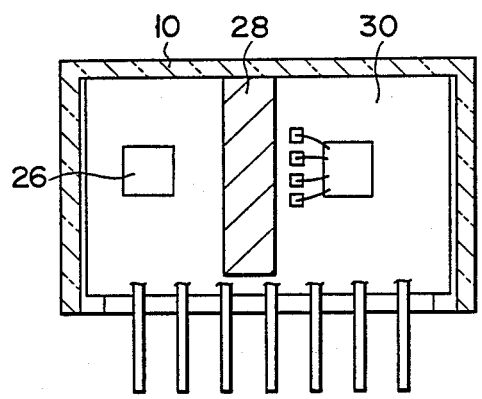
FIG. 11 is a sectional view illustrating a semiconductor pressure sensor according to the fifth embodiment of the present invention.

In the fifth embodiment shown in FIG. 11, shielding member 28 used for isolating sensor chip 18 and IC chip 26 from each other is in the form of a plate. By use of this plate-like shielding member, the interior of housing 10 is partitioned into first storage chamber 30 for sensor chip 18, and second storage chamber for IC chip 26. In the fifth embodiment, only the second storage chamber is filled with filler 36. In the fifth embodiment, housing 10 need not be provided with through-hole 32. Without this through-hole, a pressure medium to be measured can be guided to sensor chip 18 through the opening used for inserting sensor board 12.

Figure 12:
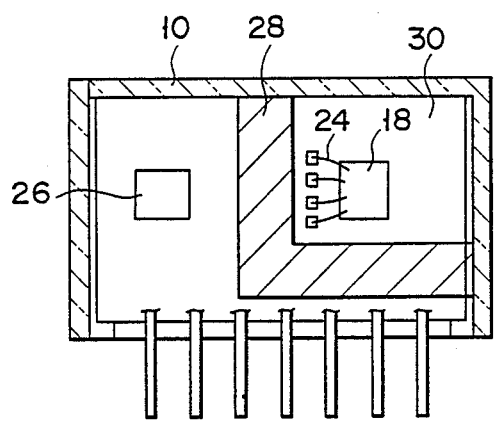
FIG. 12 is a sectional view illustrating a semiconductor pressure sensor according to the sixth embodiment of the present invention.

In the sixth embodiment shown in FIG. 12, shielding member 28 is L-shaped. In this case as well, storage chamber 30 is defined by both shielding member 28 and the inner surface of housing 10. In the present invention, therefore, shielding member 28 can be formed to have various shapes. Incidentally, in FIG. 12, through-hole 32, used for guiding a pressure medium to storage chamber 30, is not shown. Instead of forming through-hole 32, a pin hole (not shown) may be formed in housing 10 after filling the interior of housing 10 with filler 36, thereby allowing communication between storage chamber 30 and the outside of housing 10.

Figure 13:
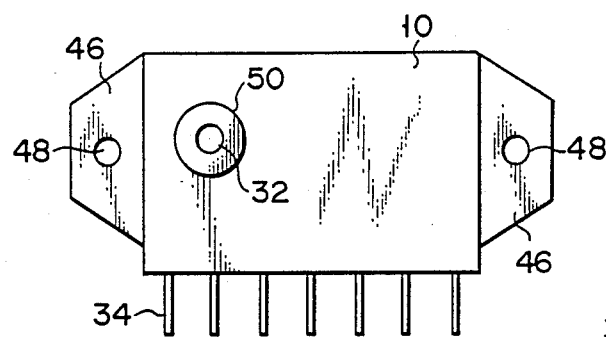
FIG. 13 is a plan view illustrating a semiconductor pressure sensor according to the seventh embodiment of the present invention.
Figure 15:
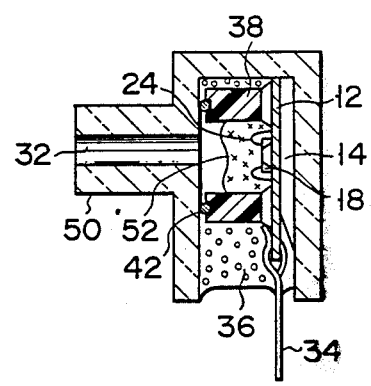
FIG. 15 is a sectional view of the sensor shown in FIG. 13.
Figure 14:
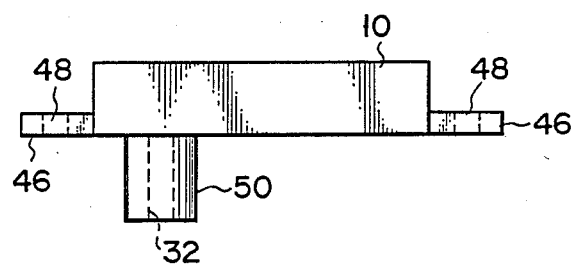
FIG. 14 is a side view of the sensor shown in FIG. 13.

The seventh embodiment of the present invention will be described with reference to FIGS. 13 to 17. In this embodiment, the semiconductor pressure sensor of the present invention is used as a negative-pressure sensor for an automobile. FIGS. 13 and 14 illustrate the outward appearance of housing 10. As illustrated, mounting piece 46 is formed on each side wall of housing 10. Through-hole 48 is formed in each mounting piece 46. Connecting pipe 50 is formed to be integral with housing 10. Connecting pipe 50 projects outwardly from housing 10, and through-hole 32, which communicates with storage chamber 30, is formed in connecting pipe 50. As can be seen from FIG. 15, the internal structure of the semiconductor pressure sensor of the seventh embodiment is similar to that of the semiconductor pressure sensor shown in FIG. 6, except in that frame 38 of the shielding member includes O-ring 42 which elastically abuts against the inner surface of housing 10, and in that frame 38 is secured to sensor board 12 by use of an adhesive. In the seventh embodiment, sensor chip 18 is connected directly to sensor board 12, and filler 52 in the form of gel, such as silicon gel, is so arranged as to cover sensor chip 18. By using such filler, sensor chip 18 can be protected from moisture or gasoline which may be included in a pressure medium to measured. Since the pouring of filler 52 into storage chamber 30 can be done before inserting sensor board 12 into housing 10, it does not complicate the manufacture of the semiconductor pressure sensor.

Figure 16:
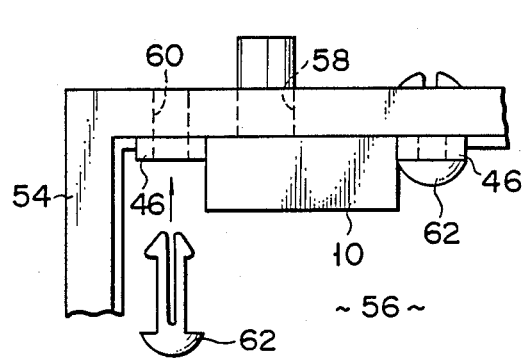
FIGS. 16 and 17 illustrate how the sensor shown in FIG. 13 is assembled on a main printed circuit board.
Figure 17:
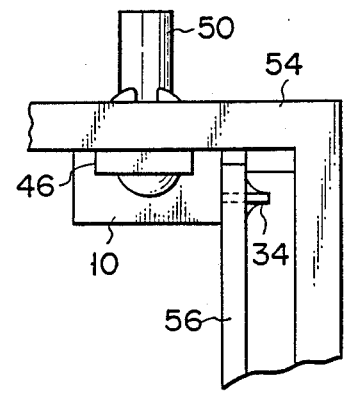

The semiconductor pressure sensor of the seventh embodiment is mounted on case 54, part of which is illustrated in FIGS. 16 and 17. In case 54, a controller (e.g., a microcomputer), for performing various kinds of control for an automobile, is mounted on main printed board 56. Hole 58 is formed in case 54, so as to allow insertion of connecting pipe 50 of the semiconductor pressure sensor. In addition, a pair of holes 60, which correspond to through-holes 48, are formed in case 54.

A description will be given of how the semiconductor pressure sensor is incorporated in case 54. First of all, connecting pipe 50 of the semiconductor pressure sensor is inserted into hole 58 of case 54. After positioning holes 48 of the semiconductor pressure sensor relative to hole 60 of case 54, fixing pin 62 is inserted into through-hole 48 and hole 60, thereby securing the semiconductor pressure sensor to case 54. And, simultaneously, connecting legs 34 of the semiconductor pressure sensor are inserted into the holes of printed board 56. Connecting legs 34 are electrically connected to main printed board 56 by soldering. If the semiconductor pressure sensor is secured to case 54 in this fashion, it is possible to reduce the load which may be applied to connecting legs 34. Connecting pipe 50, which is outwardly projected from case 54, is connected to the air intake passage of an automobile by means of a hose (not shown), and part of the intake air to be supplied to sensor chip 18 of the semiconductor pressure sensor can be guided through the air intake passage.

The present invention is not limited to the embodiments mentioned above. In the embodiment shown in FIG. 1, sensor chip 18 and IC chip 26 are arranged on sensor board 12 in a line perpendicular to the direction in which connecting legs 34 extend. However, they may be arranged in a line parallel to the direction in which connecting legs 34 extend. If sensor chip 18 and IC chip 26 are arranged in this fashion, it is possible to further reduce the area which the semiconductor pressure sensor may occupy on main printed board 56. In the seventh embodiment, the semiconductor pressure sensor of the present invention is applied to measurement of the pressure of the intake air of an engine. Needless to say, the application of the present invention is not limited to the measurement of this pressure. The present invention can be used for measurement of the pressure of pressure media of various kinds.

What is claimed is:

1. A semiconductor pressure sensor for measuring a pressure of a pressure medium, comprising:
   a housing;
   a board located in the housing and having a circuit face on which a wiring pattern in formed;
   a pressure-sensing chip formed of a semiconductor and assembled on the circuit face of the board, the pressure-sensing chip being adapted to measure the pressure of the pressure medium;
   at least one semiconductor chip assembled on the circuit face of the board and operating in cooperation with the pressure-sensing chip;
   a shielding member which is located in the housing in such a manner as to isolate the pressure-sensing chip from the semiconductor chip and to define a storage chamber for the pressure-sensing chip in the housing, together with the housing and the board;
   means, provided in the housing, for guiding a pressure medium to be measured into the storage chamber; and
   a filler which fills at least the interior of the housing outside the storage chamber such that the semiconductor chip is embedded in the filler.

2. A semiconductor pressure sensor according to claim 1; wherein the shielding member is formed of an elastic material which is secured to the board in an airtight manner and which seals the storage chamber in an airtight manner by contacting an inner surface of the housing.

3. A semiconductor pressure sensor according to claim 1, wherein the shielding member has a shape that encloses the pressure-sensing chip.

4. A semiconductor pressure sensor according to claim 1, wherein the shielding member includes:
   a frame member which encloses the pressure-sensing chip and is secured to the board in an airtight manner, and
   a sealing member for partitioning the storage chamber by providing a seal between the frame member and the inner surface of the housing.

5. A semiconductor pressure sensor according to claim 1, wherein the shielding member includes:
   a shielding element which encloses the pressure-sensing chip and is secured to the board in an airtight manner and which defines a certain gap with the inner surface of the housing, and
   a filler which partitions the storage chamber in an airtight manner by filling the gap between the shielding element and the inner surface of the housing.

6. A semiconductor pressure sensor according to claim 1, wherein the housing is formed of a transparent material.

7. A semiconductor pressure sensor according to claim 1, wherein the housing has a finely roughened surface where it contacts the filler.

8. A semiconductor pressure sensor according to claim 1, further comprising a plurality of connecting legs, arranged in the same plane as the board, for picking up an electrical signal from the pressure-sensing chip and leading it to the outside of the sensor, the connecting legs being electrically connected, at one end, to the board, and, at the other end, to a printed circuit board.

9. A semiconductor pressure sensor according to claim 1, wherein the guiding means includes a hole formed in the housing and communicating with the storage chamber.

10. A semiconductor pressure sensor according to claim 1, wherein the hole is formed in such a manner that an extension of its center axis is shifted from the pressure-sensing chip.

11. A semiconductor pressure sensor according to claim 1, wherein the filler also fills the storage chamber such that the pressure-sensing chip is embedded in the filler.

12. A semiconductor pressure sensor according to claim 1, further comprising a second filler which fills the storage chamber such that the pressure-sensing chip is embedded in the second filler, and wherein the material of the second filler differs from that of the filler embedding said semiconductor chip.

13. A semiconductor pressure sensor according to claim 1, wherein the shielding member includes a straight plate which partitions the housing into the storage chamber and a second storage chamber.

* * * * *